United States Patent
Pan et al.

(10) Patent No.: US 6,720,031 B2
(45) Date of Patent: Apr. 13, 2004

(54) METHOD OF CONTROLLING THE INITIAL GROWTH OF CVD COPPER FILMS BY SURFACE TREATMENT OF BARRIER METALS FILMS

(75) Inventors: Wei Pan, Vancouver, WA (US); David Russell Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 51 days.

(21) Appl. No.: 09/978,434

(22) Filed: Oct. 16, 2001

(65) Prior Publication Data

US 2003/0072880 A1 Apr. 17, 2003

(51) Int. Cl.$^7$ ............................................. C23C 16/18
(52) U.S. Cl. .................... 427/250; 427/252; 427/255.28
(58) Field of Search ................................ 427/250, 252, 427/25.28

(56) References Cited

U.S. PATENT DOCUMENTS 5,744,192 A    4/1998   Nguyen et al. ................ 427/99

6,355,562 B1 * 3/2002 Charneski et al. .......... 438/681

OTHER PUBLICATIONS

Article by Gelatos et al., entitled "Chemical Vapor Deposition of Copper from Cu+1 Precursors in the Presence of Water Vapor", published in Appl. Phys. Lett. 63(20), 1993, pp. 2842–2844.
Article by Norman, et al., entitled "Chemical Additives For Improved Copper CVD Processing", published in Thin Solid Films 262 (1995) pp. 46–51, 1994.
Article by Jain et al., entitled "Chemical Vapor Deposition of Copper from (hfac)CuL(L=tmvs and 2-butyne) in the Presence of Water, Methanol and Dimethyl Ether", published in Chem. Mater., 8, pp. 1119–1127, 1996.

* cited by examiner

Primary Examiner—Timothy Meeks
(74) Attorney, Agent, or Firm—David C. Ripma; Matthew D. Rabdau; Scott C. Krieger

(57) ABSTRACT

A method of chemical vapor deposition (CVD) of copper films includes preparing a substrate, including forming structures thereon have a barrier metal exposed surface; placing the prepared substrate into a CVD chamber; heating the substrate to a temperature of between about 200° C. and 250° C.; introducing a water flow in a carrier gas for at least one minute; stopping the water flow; and starting the flow of copper precursor.

7 Claims, 2 Drawing Sheets

METHOD OF CONTROLLING THE INITIAL GROWTH OF CVD COPPER FILMS BY SURFACE TREATMENT OF BARRIER METALS FILMS

RELATED APPLICATIONS

This application is related to Ser. No. 09/817,836, filed Mar. 26, 2001, for Method of Improving Copper Thin Film Adhesion to Metal Nitride Substrates with Water, and Ser. No. 09/820,227, filed Mar. 27, 2001, for Method to Deposit High Adhesive Copper Thin Film Adhesion on Metal Nitride Substrates.

FIELD OF THE INVENTION

This invention relates to MOCVD deposition of interlayer metal conductors in integrated circuit fabrication, and specifically to a technique for providing superior adhesion of a copper thin film to a barrier metal.

BACKGROUND OF THE INVENTION

The use of water in CVD of copper is known from Gelatos, et al, "Chemical vapor deposition of copper from Cu+1 precursors in the presence of water vapor", Appl. Phys. Lett. 63(20), 1993, pp. 2842–2844, wherein a method of adding water vapor to Cu(hfac)(tmvs), where hfac= hexafluoroacetylaceton and tmvs=trimethylvinylsilane, improves the deposition rate of copper and decrease the resistivity of the deposited copper thin films. Hochberg, et al., disclose a method of adding water to a Cu(hfac)(tmvs) precursor in the form of hexafluoroacetylacetone (hfac) dihydrate (H(hfac)(2H$_2$O), in "Chemical Additives For Improved Copper CVD Processing Using (hfac)Cu(tmvs)", Advanced Metallization for ULSI Applications, 1994, wherein the stability of the precursor is improved and the deposition rate of copper thin films are increased, however, the conductivity of the copper thin films is not improved, and the formed copper thin films have a rough texture.

Jain, et al., "Chemical Vapor Deposition of Copper from (hfac)CuL (L=tmvs and 2-butyne) in the Presence of Water, Methanol and Dimethyl Ether", Chem. Mater., 8, pp 1119–1127, 1996, disclose a method of adding water vapor to (hfac)Cu(tmvs). The deposition rate of the copper precursor is improved, but the resistivity of the deposited copper is poor.

U.S. Pat. No. 5,744,192, granted Apr. 28, 1998 to Nguyen et al., for *Method of using water vapor to increase the conductivity of cooper deposited with Cu(hfac) TMVS*, describes a techniques of simultaneously injecting water and a copper precursor, wherein the water is vaporized into vaporized copper precursor prior to introduction of either the water or precursor into a CVD chamber. This is the currently method of injecting water along with copper precursor during CVD of copper films.

SUMMARY OF THE INVENTION

A method of chemical vapor deposition (CVD) of copper films includes preparing a substrate, including forming structures thereon have a barrier metal exposed surface; placing the prepared substrate into a CVD chamber; heating the substrate to a temperature of between about 200° C. and 250° C.; introducing a water flow in a carrier gas for at least one minute; stopping the water flow; and starting the flow of copper precursor.

An object of the invention is to provide a method of superior trench filling and step covering by copper films when deposited over barrier metals.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

This invention describes a different way to deposit copper films with will exhibit better step coverage, trench fill and adhesive characteristics when applied over a barrier metal film. The invention provides an effective method to control the way in which a copper film grows on barrier metal films during chemical vapor deposition (CVD). A water surface treatment is applied to the barrier metal films prior to introducing a Cu precursor into a CVD chamber. By introducing a pre-deposition surface water treatment step, the as-deposited copper films has better adhesion, trench fill and step coverage characteristics. This invention describes a technique and apparatus which controls copper CVD, and the initial growth of a copper film, which therefore leads to a superior copper CVD process. It is well known to those of ordinary skill in the art that copper CVD generally produces a copper film which does not adhere to underlying barrier metal films, such as TiN or TaN. There are known ways to enhance copper film adhesion. The most effective way is injecting water along with a copper precursors, as described in the above-identified related applications. Equipment vendors, i.e., Applied Materials, Novellus, CVC, etc., provide CVD apparatus which allows injecting water during copper precursor flow during copper CVD.

The method of the invention is a variation of the copper CVD process. The amount of water injected into the deposition chamber is critical to providing desirable adhesion characteristics and film properties. The window for proper water injection is relatively small. If too little water is injected, there will be no enhancement of copper adhesion. If too much water is injected, the resistivity of the as-deposited copper films will be very high. Results from copper CVD initial growth studies indicates that the injected water acts as a surface "poisoning agent," which blocks fluorine from attaching to barrier metal surface. The water also expels barrier metal surface adsorbents.

Figure 1:
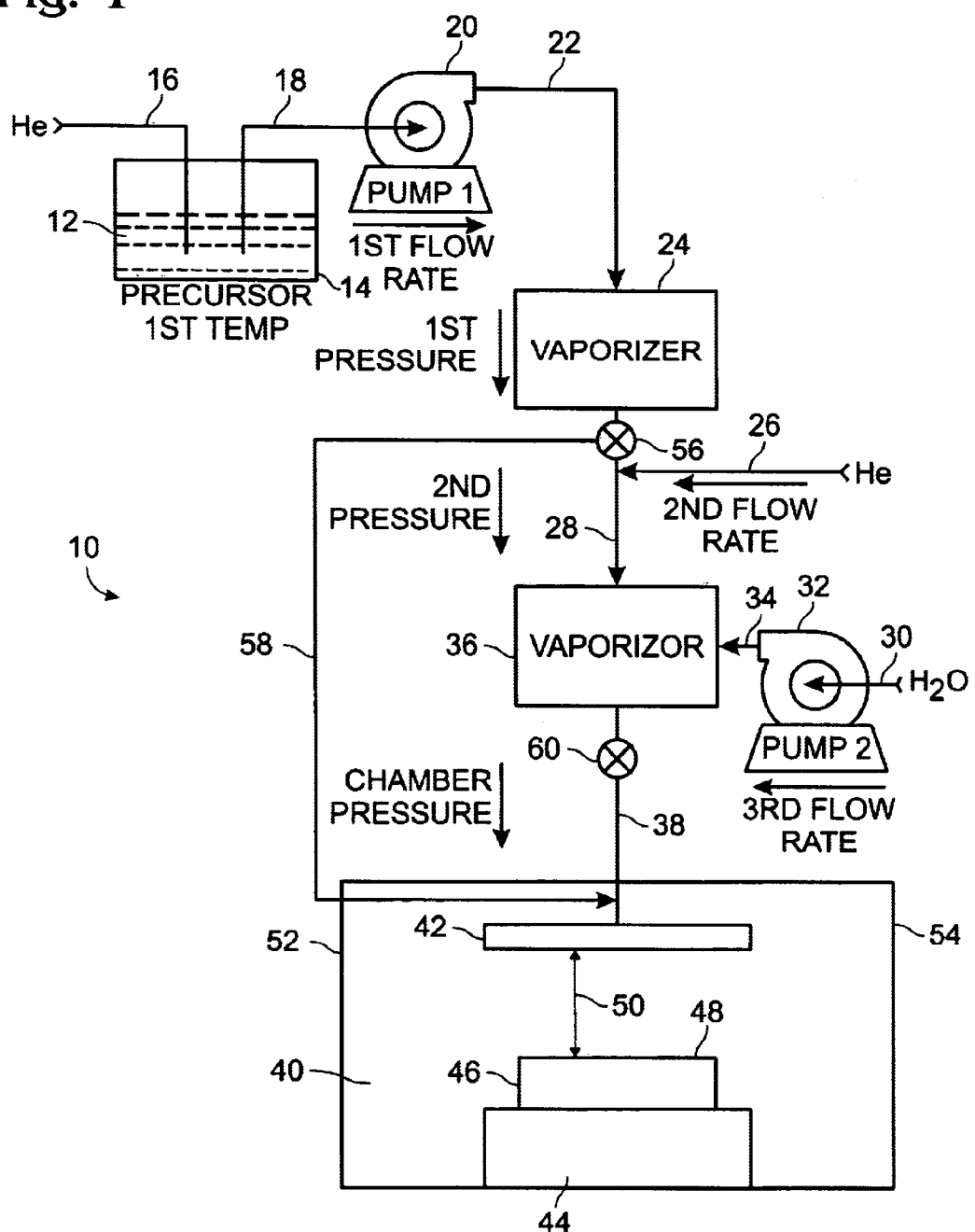
FIG. 1 is a schematic diagram of a CVD apparatus modified to allow practice of the method of the invention.

FIG. 1 illustrates a CVD apparatus for carrying out the method of the invention, generally at 10. The copper precursor, such as Cu(hfac)TMVS, begins the process in its pure form as a liquid 12. Liquid precursor 12 is stored in a container 16 and kept at a first temperature. An inert gas, such as helium (He), is introduced to liquid precursor 12 in a line 16. Liquid precursor 12 exits container 14 in a line 18 and passes through pump 20 into a line 22. Between the introduction of the inert gas in line 16 and pump 20, a first flow rate for liquid precursor 12 is established in line 22 which can be expressed in units of standard cubic centimeters (sccm).

Liquid precursor 12 enters a precursor vaporizer 24 where the precursor is vaporized. The vaporized precursor now has a first pressure which can be represented in units of Torr (T) or milliTorr (mT). An inert gas, such as helium, is introduced to the vaporized precursor. The inert gas has a second flow rate in a line 26. After being mixed with the vaporized precursor, the precursor/inert gas mixture has a second pressure in a line 28.

Liquid water enters the system in a line 30, goes through a second pump 32 and enters a line 34. The liquid water has a third flow rate which can be expressed in sccm. The liquid water enters a vaporizer 36 where it becomes water vapor and is mixed with the combination of inert gas and vaporized precursor represented by the second pressure in line 28. The water vapor has a third pressure which mixes with the second pressure in a line 38 to become a chamber pressure. As mentioned earlier, the ratio of the water pressure to the chamber pressure is called a partial pressure. The partial pressure of the water vapor needed to perform the present invention can be expressed as the ratio of the water vapor pressure to the total chamber pressure. Water vapor in prior art systems may be added into the system in line 22 or 28.

The contents of line 38 are introduced into a deposition chamber 40. Specifically, the copper precursor blend is distributed in chamber 40 by a showerhead 42. Also located in chamber 40 is a wafer chuck 44, and mounted upon chuck 44 is a wafer 46 having a copper-receiving surface 48. The spacing between showerhead 42 and copper-receiving surface 48 is represented by reference designator 50. In addition, chamber 40 has walls 52, 54. The modifications for the method of the invention to apparatus 10 is the inclusion of a valve 56 and line 58, which distribute the vaporized precursor directly to showerhead 42, and a valve 60, which controls the flow of water vapor from vaporizer 36.

The method of the invention is conducted as follows: A substrate is prepared in accordance with state-of-the-art techniques, including formation of various IC structures on the substrate wafer, which structures include barrier metal layers over some of the surfaces. Copper is to be deposited on portions of the substrate structures, including on at a portion of the barrier metals. Once the barrier metals are in place, the substrate is placed in a CVD chamber, such as chamber 40 of FIG. 1, and heated to a temperature of at least 200° C. The upper temperature for this step of the process is 250° C. Water is introduced into the CVD chamber, carried by a carrier gas, such as Ar, He, or $N_2$, for at least one minute, and up to five minutes. The water flow in line 34 is between about 0.005 ml/min and 0.010 ml/min, resulting in a water vapor flow in line 38 of between about 100 sccm and 150 sccm.

The water flow is stopped by closing valve 60, and a copper precursor flow is started by opening valve 56 into line 58, using well established copper CVD protocols, such as are described in the above-identified related applications.

Figure 2:
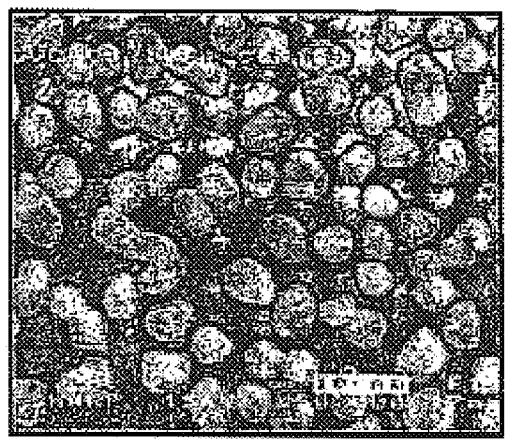
FIG. 2 is a microphotograph of a copper film formed under normal CVD protocols.
Figure 3:
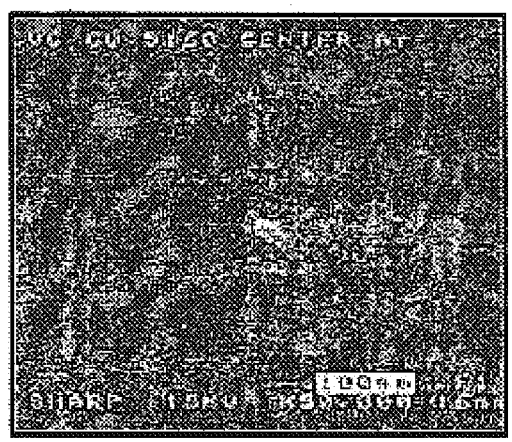
FIG. 3 is a microphotograph of a copper film formed under CVD protocols with introduction of Ar/He gas.
Figure 4:
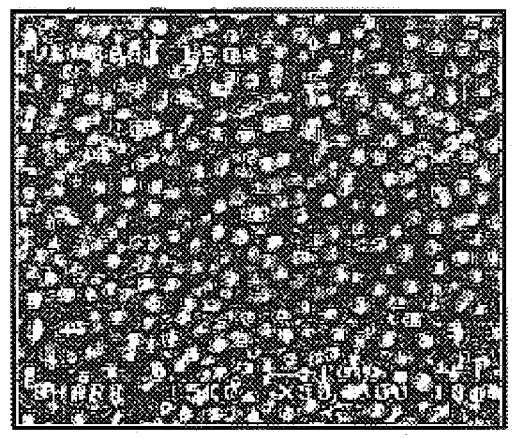
FIG. 4 is a microphotograph of a copper film formed under the CVD protocols of the method of the invention.

FIGS. 2–4 are scanning electron microphotographs showing the effects of the surface treatment of the invention. FIG. 1 depicts a copper film without any treatment; FIG. 2 depicts a copper film with surface Ar/He treatment under vacuum; and FIG. 3 depicts a copper film with the surface water treatment of the method of the invention under vacuum. The copper CVD conditions were fixed for all cases. The copper deposition time was 80 seconds. As expected, copper deposition without any treatment produces copper segments of varying size and shape, having an irregular distribution. The Ar/He treatment produced very few copper segments on the barrier metal, while the method of the invention produces many copper segments, of uniform size and distribution. The growth of CVD Cu is well controlled in the efforts of surface treatment of underlying barrier metal films.

Thus, a method of controlling the initial growth of CVD copper films by surface treatment of barrier metals films has been disclosed. It will be appreciated that further variations and modifications thereof may be made within the scope of the invention as defined in the appended claims.

What is claimed is:

1. A method of chemical vapor deposition (CVD) of copper films comprising:

preparing a substrate, including forming structures thereon have a barrier metal exposed surface;

placing the prepared substrate into a CVD chamber;

heating the substrate to a temperature of between about 200° C. and 250° C.;

introducing a water flow in a carrier gas for at least one minute at a water flow of between about 0.005 ml/win and 0.010 ml/min;

stopping the water flow; and starting the flow of copper precursor.

2. The method of claim 1 wherein said introducing a water flow includes providing a carrier gas taken from the group of carrier gases consisting of Ar, He and $N_2$.

3. The method of claim 1 wherein said introducing a water flow includes allowing the water flow to last for a maximum of five minutes.

4. The method of claim 1 wherein said introducing a water flow includes providing a water vapor flow of between about 100 sccm and 150 sccm.

5. A method of chemical vapor deposition (CVD) of copper films comprising:

preparing a substrate, including forming structures thereon have a barrier metal exposed surface;

placing the prepared substrate into a CVD chamber;

heating the substrate to a temperature of between about 200° C. and 250° C.;

introducing a water flow of between about 0.005 ml/min and 0.010 ml/min, in a carrier gas for between about at least one minute and five minutes;

stopping the water flow; and starting the flow of copper precursor.

6. The method of claim 5 wherein said introducing a water flow wherein the carrier gas is taken from the group of carrier gases consisting of Ar, He and $N_2$.

7. The method of claim 5 wherein said introducing a water flow includes providing a water vapor flow of between about 100 sccm and 150 sccm.

* * * * *